United States Patent [19]
Kawaguchi et al.

[11] Patent Number: 5,777,371
[45] Date of Patent: *Jul. 7, 1998

[54] HIGH-BREAKDOWN-VOLTAGE SEMICONDUCTOR DEVICE

[75] Inventors: Yusuke Kawaguchi, Kanagawa-ken; Yoshihiro Yamaguchi, Urawa; Hideyuki Funaki, Tokyo, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 716,863

[22] Filed: Sep. 20, 1996

[30] Foreign Application Priority Data

Sep. 29, 1995 [JP] Japan .................. 7-253290

[51] Int. Cl.$^6$ ............... H01L 29/76; H01L 29/94
[52] U.S. Cl. ............. 257/409; 257/339; 257/408; 257/506
[58] Field of Search ................. 257/339, 409, 257/408, 506

[56] References Cited

U.S. PATENT DOCUMENTS

| | | | |
|---|---|---|---|
| 4,567,502 | 1/1986 | Nakagawa et al. | 257/339 |
| 4,952,991 | 8/1990 | Kayama | 257/339 |
| 5,477,067 | 12/1995 | Isomura et al. | 257/211 |

OTHER PUBLICATIONS

Taylor Efland, et al., "An Optimized Resurf LDMOS Power Device Module Compatible with Advanced Logic Processes", IEDM Technical Digest 1992, pp. 237–240.

Masakatsu Hoshi, et al., "Low On–Resistance LDMOS-FETS with DSS (A Drain Window Surrounded by Source Windows) Pattern Layout", Proceedings of 1995 International Symposium on Power Semiconductor Devices & ICs, Yokohama, pp. 63–67, May 23, 1995.

Primary Examiner—Valencia Martin Wallace
Attorney, Agent, or Firm—Oblon, Spivak, McClelland, Maier & Neustadt, P.C.

[57] ABSTRACT

A high-breakdown-voltage semiconductor device includes a high-resistance semiconductor layer, a drift layer of the first conductivity type selectively formed in the surface of the high-resistance semiconductor layer, a drain layer formed in the surface of the drift layer of the first conductivity type, base layers of the second conductivity type selectively formed in the surface of the high-resistance semiconductor layer, a plurality of island-shaped source layers of the first conductivity type formed in the surfaces of the base layers of the second conductivity type, a gate electrode formed on the base layers of the second conductivity type between the source layers of the first conductivity type and the drift layer of the first conductivity type and between adjacent source layers of the first conductivity type via a gate insulating film, a drain electrode which contacts the drain layer, and source electrodes which contact both the source layers of the first conductivity type and the base layers of the second conductivity type.

18 Claims, 12 Drawing Sheets

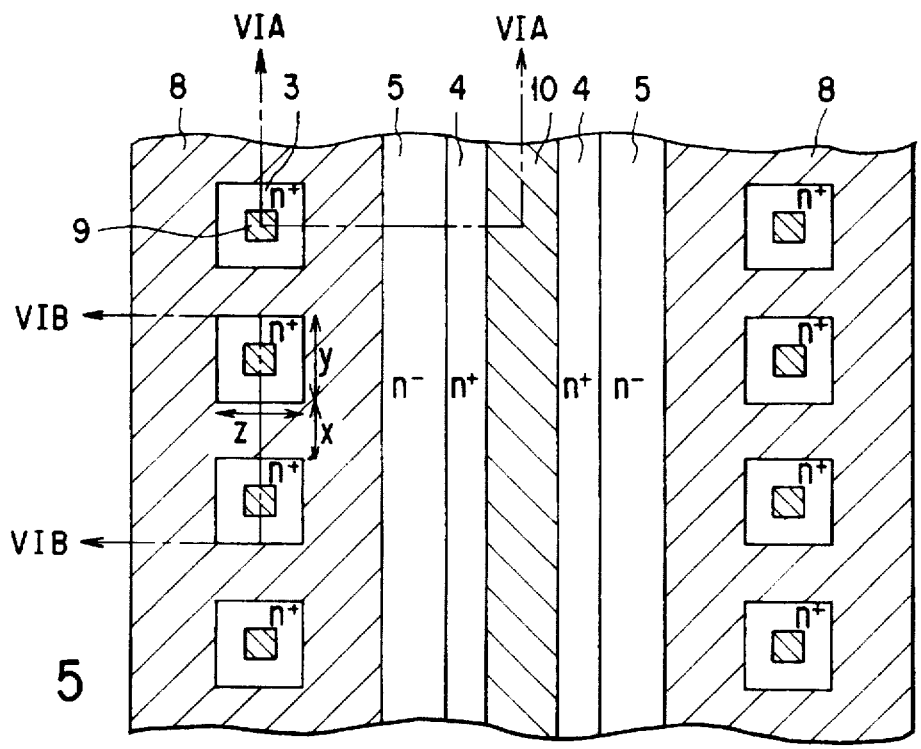
F I G. 5

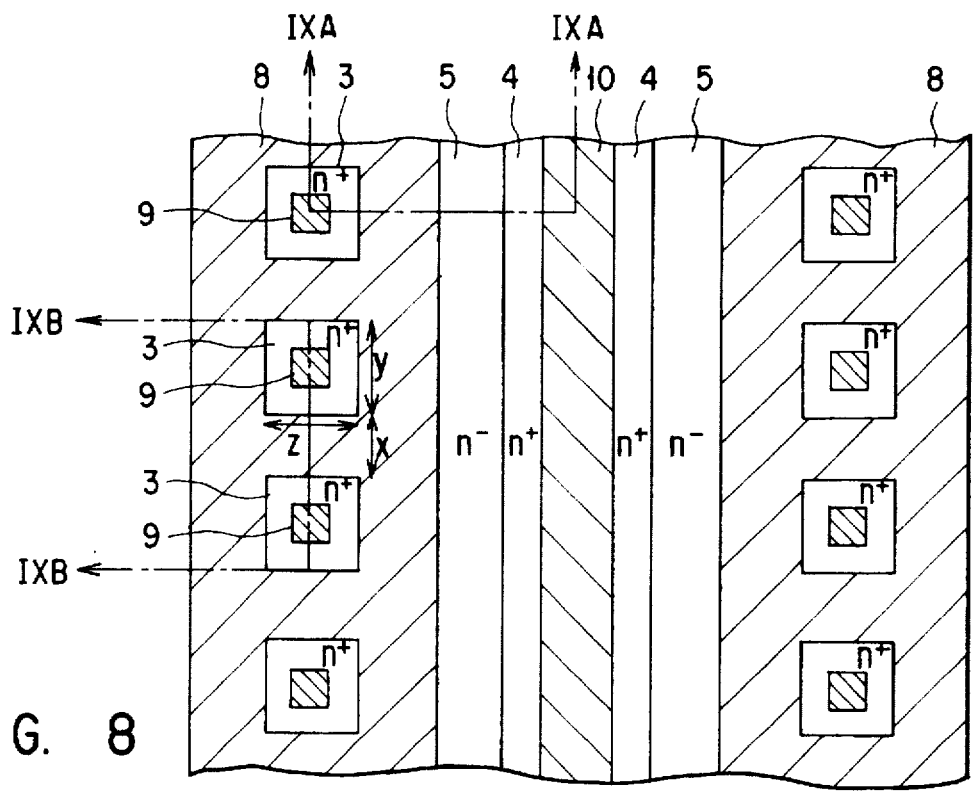
F I G. 8
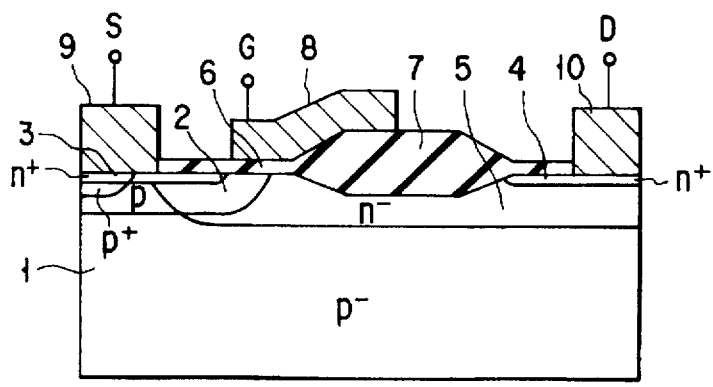
F I G. 9A
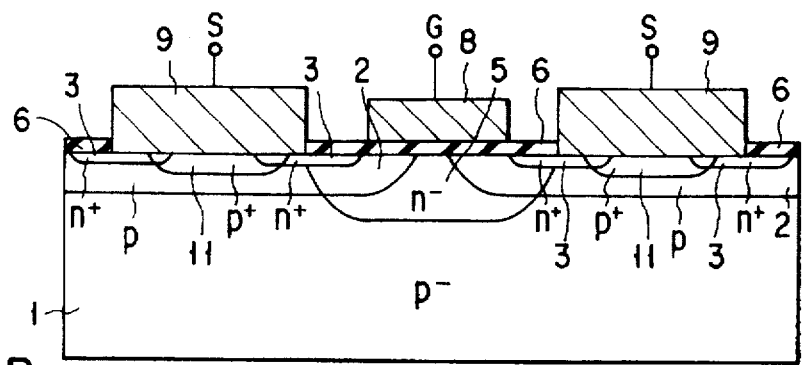
F I G. 9B

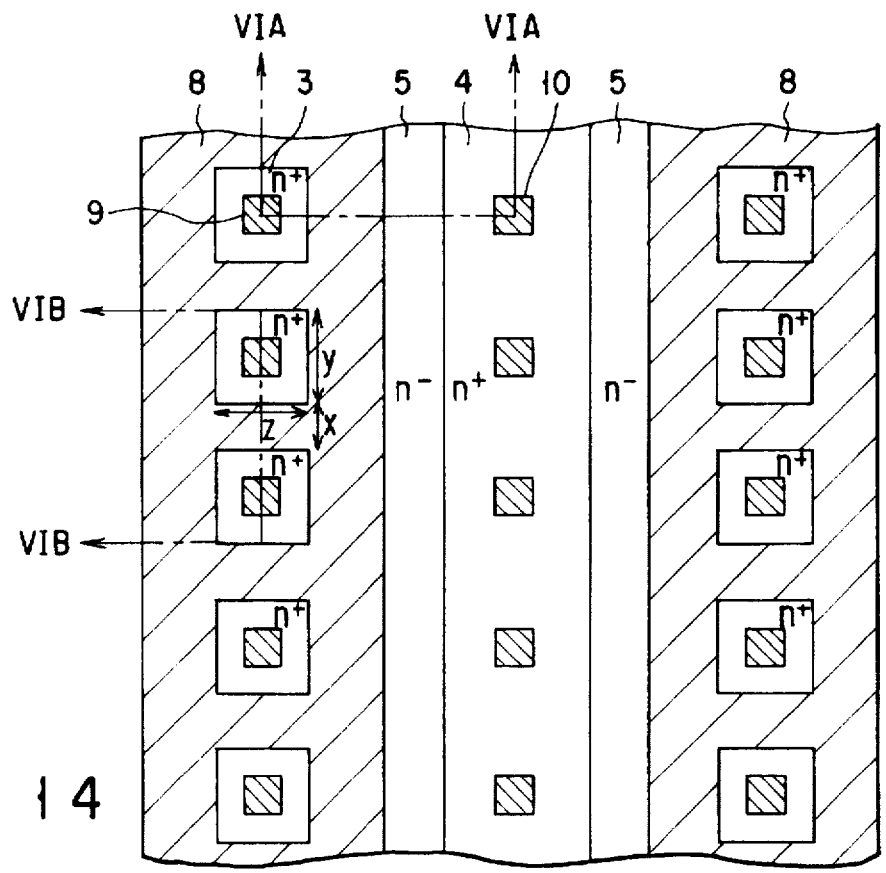
F I G. 14
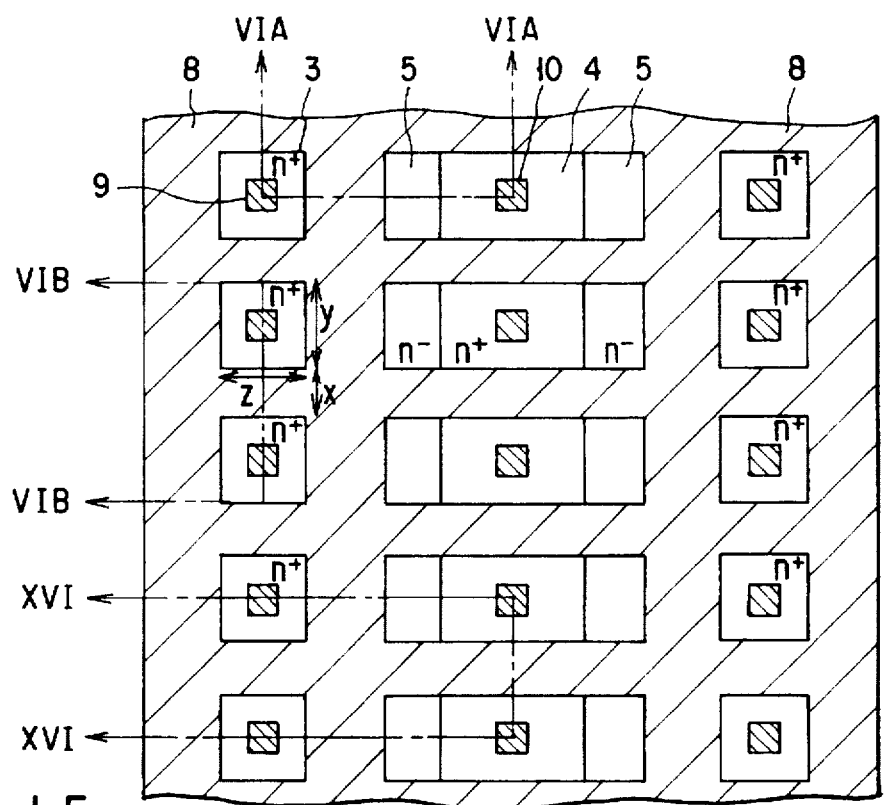
F I G. 15

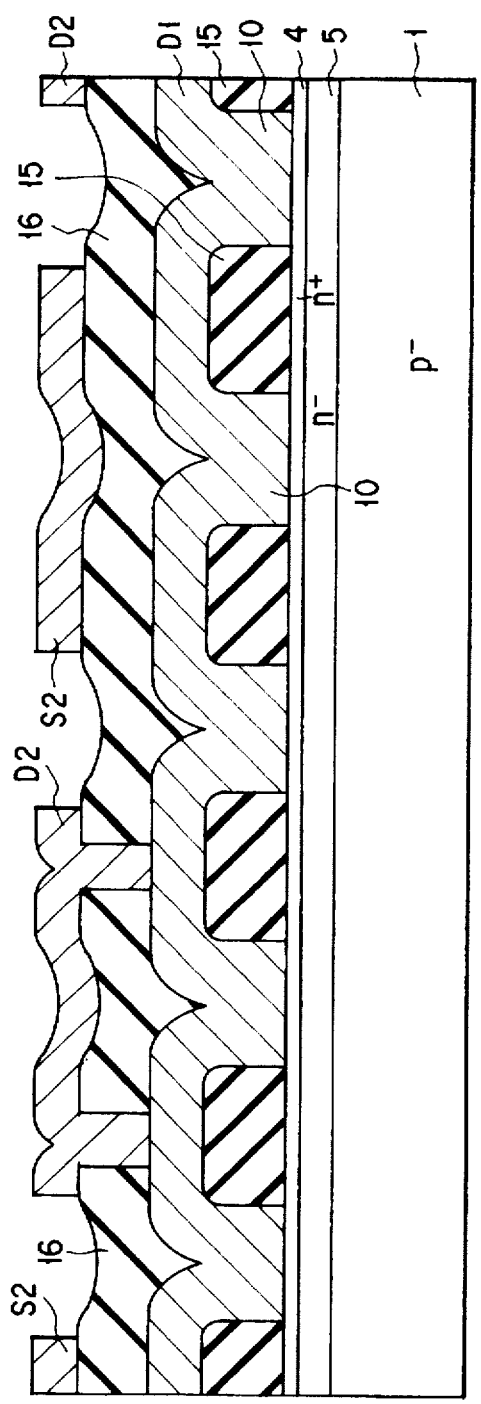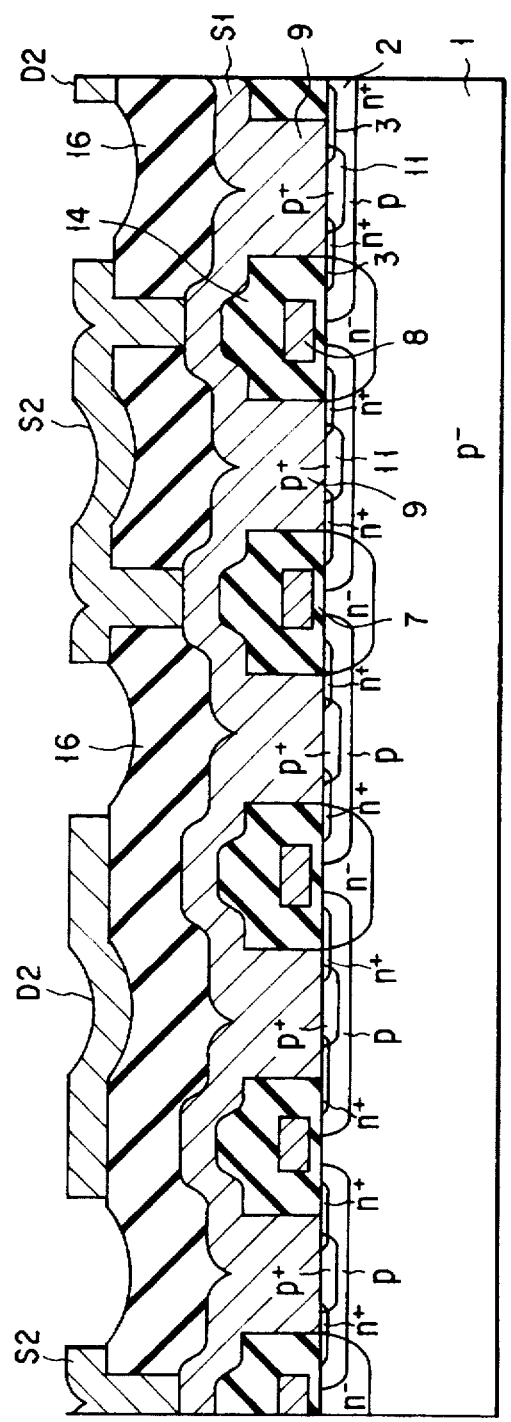
F I G. 19
F I G. 20

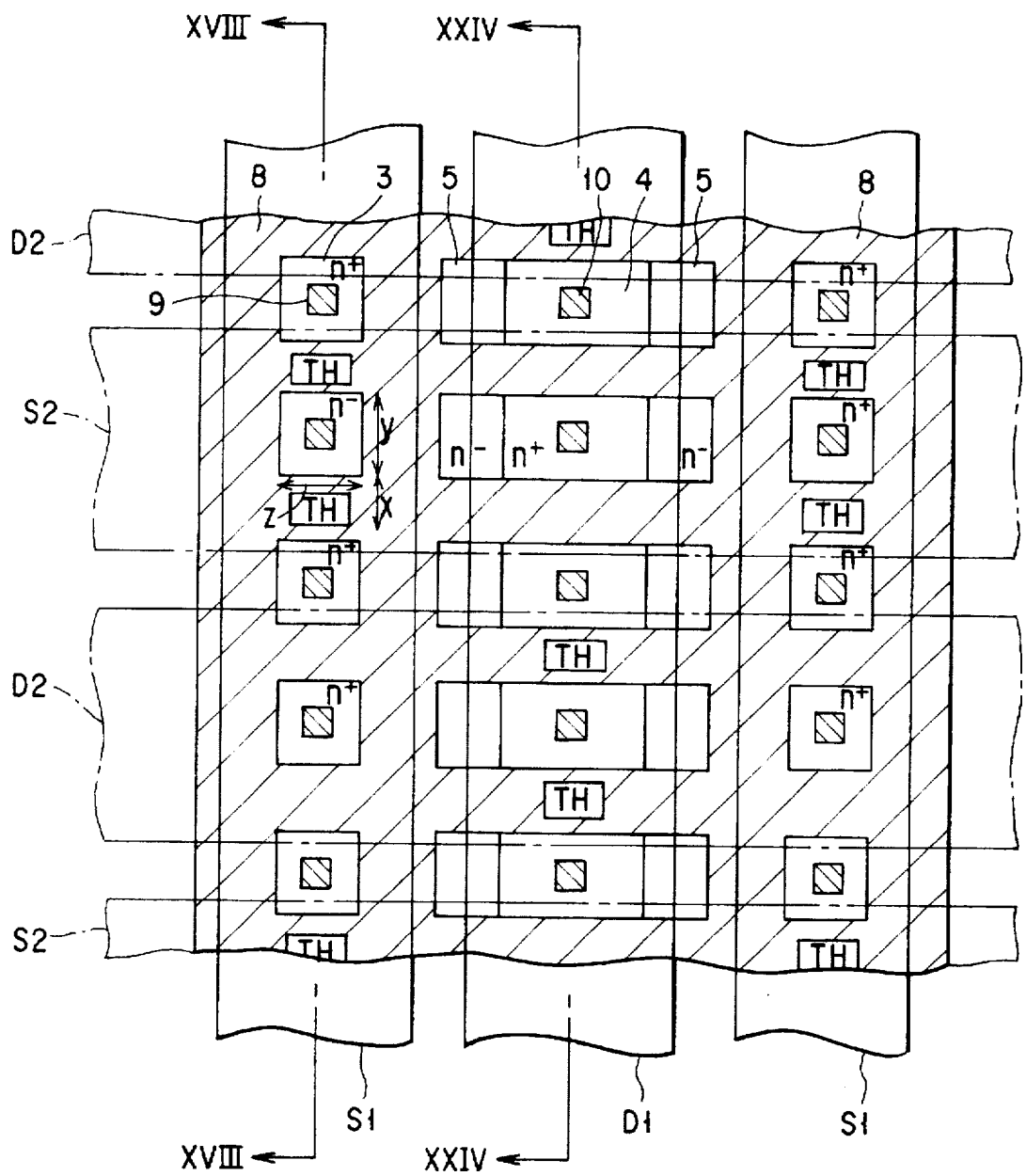
F I G. 23

HIGH-BREAKDOWN-VOLTAGE SEMICONDUCTOR DEVICE

BACKGROUND OF THE INVENTION

1. Field of the Invention

The present invention relates to a high-breakdown-voltage semiconductor device and, more particularly, to a lateral high-breakdown-voltage semiconductor device having an island-shaped source electrode.

2. Description of the Related Art

Conventionally, a power IC has been known in which a high-breakdown-voltage semiconductor element used for a high-breakdown-voltage driving circuit or the like and a low-breakdown-voltage semiconductor element used for a low-breakdown-voltage driving circuit or the like are formed on a single substrate. The power IC can be used in a variety of applications. A low on-resistance is required for a high-breakdown-voltage MOSFET used in the output stage of a power IC of this type.

FIG. 1 is a plan view showing the element structure of a high-breakdown-voltage MOSFET of this type, and FIG. 2 is a sectional view taken along the line II—II in FIG. 1.

Referring to FIG. 2, reference numeral 101 denotes a p-type semiconductor substrate having a high resistance. A p-type base layer 102 is selectively formed in the surface of the p-type semiconductor substrate 101. An n-type source layer 103 having a low resistance is formed in the surface of the p-type base layer 102. An n-type drain layer 104 having a low resistance is formed in the surface of the p-type semiconductor substrate 101 except for the p-type base layer 102. The n-type drain layer 104 is formed in an n-type drift layer 105 having a high resistance.

A gate electrode 108 is formed via a gate oxide film 106 and a field oxide film 107 on the surface of the p-type base layer 102 sandwiched between the n-type source layer 103 and the n-type drift layer 105 and on part, adjacent to this surface, of the surface of the n-type drift layer 105. Reference numeral 109 denotes a source electrode which contacts the n-type source layer 103; and 110, a drain electrode which contacts the n-type drain layer 104.

The planar shape of these layers and electrodes is a stripe shape, as shown in FIG. 1.

The high-breakdown-voltage MOSFET having this arrangement is higher in breakdown voltage than a normal MOSFET because the n-type drain layer 104 is formed in the n-type drift layer 105.

In the conventional high-breakdown-voltage MOSFET shown in FIGS. 1 and 2, to increase the current capacity with the same area, the current density per unit area must be increased. In other words, the on-resistance must be reduced. To reduce the on-resistance, it is effective to increase the effective channel width. However, in the conventional high-breakdown-voltage MOSFET shown in FIGS. 1 and 2, the width of a channel region formed below the gate electrode 108 is constant. Therefore, a sufficiently low on-resistance cannot be obtained.

Next, the wiring method of the conventional high-breakdown-voltage MOSFET described above will be explained.

In the conventional high-breakdown-voltage MOSFET, the source electrode 109, the gate electrode 108, and the drain electrode 110 are arranged in a stripe shape, as shown in FIG. 1.

These electrodes 108 to 110 function as lower interconnections, and each lower interconnection is individually connected to each pad (not shown) via an upper interconnection. The two-level interconnection structure constituted by the lower and upper interconnections is classified into two types, i.e., a parallel interconnection scheme and an orthogonal interconnection scheme.

The parallel interconnection scheme provides a structure in which an upper interconnection is arranged parallel to the longitudinal direction of a lower interconnection. The parallel interconnection scheme has an advantage of a large contact area between the lower and upper interconnections. However, a large lift-off width between the interconnections must be ensured in the parallel interconnection scheme because the upper interconnection is generally formed of a thick aluminum film. Even if an element is micropatterned, a pitch between the source and drain cannot be decreased.

On the other hand, the orthogonal interconnection scheme provides a structure in which upper interconnections So and Do are arranged perpendicular to the longitudinal direction of the lower interconnections (109 and 110), as shown in FIG. 3. A lift-off width between the interconnections can be set at an arbitrary value. With micropatterning of an element, a pitch between the source and drain can be decreased.

In the orthogonal interconnection scheme, however, when a through hole defined by the lower interconnection (109 or 110) and the upper interconnection So or Do, and a contact hole defined by the lower interconnection and the n-type source or drain layer 103 or 104 are arranged to overlap each other, a recessed portion is formed in the surface of the lower interconnection in the contact hole region, as shown in FIG. 4. An impurity Ip remains in this recessed portion to increase the wiring resistance. For this reason, the orthogonal interconnection scheme has a limitation that the through hole and the contact hole cannot overlap each other.

Even if, however, the through hole is formed not to overlap the contact hole in accordance with this limitation, the area of the through hole defined by the lower interconnection (109 or 110) and the upper interconnection So or Do is decreased to increase the wiring resistance at the through hole portion. If the area of the contact hole is decreased to increase the area of the through hole, the contact resistance increases, resulting in an increase in on-resistance of the whole element.

SUMMARY OF THE INVENTION

It is an object of the present invention to provide a high-breakdown-voltage semiconductor device having a low on-resistance.

More specifically, the above object of the present invention is to provide a high-breakdown-voltage semiconductor device in which the channel width below a gate electrode can be increased without increasing the contact resistance of a source electrode.

It is another object of the present invention to provide the above-described high-breakdown-voltage semiconductor device which has two-level interconnections having a low wiring resistance and is suitable for micropatterning and integration.

To achieve the above objects, according to the present invention, the first high-breakdown-voltage semiconductor device is characterized by comprising a high-resistance semiconductor layer, a drift layer of a first conductivity type selectively formed in a surface of the high-resistance semiconductor layer, a drain layer formed in a surface of the drift layer of the first conductivity type, base layers of a second conductivity type selectively formed in the surface of the high-resistance semiconductor layer, a plurality of island-shaped source layers of the first conductivity type formed in surfaces of the base layers of the second conductivity type, a gate electrode formed on the base layers of the second conductivity type between the source layers of the first conductivity type and the drift layer of the first conductivity type and between adjacent source layers of the first conductivity type via a gate insulating film, a drain electrode which contacts the drain layer, and source electrodes which contact both the source layers of the first conductivity type and the base layers of the second conductivity type.

According to the present invention, the plurality of island-shaped source layers of the first conductivity type are formed in the surfaces of the base layers of the second conductivity type. Since the gate electrode is also formed on the portion between the adjacent source layers of the first conductivity type, channels are formed between the source layers of the first conductivity type. For this reason, the effective channel width can be increased, compared to a conventional high-breakdown-voltage semiconductor device in which a gate electrode is formed only between a source layer of the first conductivity type and a drift layer of the first conductivity type to form a channel. A low on-resistance can be obtained.

According to the present invention, the second high-breakdown-voltage semiconductor device is characterized by comprising a high-resistance semiconductor layer, a drift layer of a first conductivity type selectively formed in a surface of the high-resistance semiconductor layer, a drain layer formed in a substantially stripe shape in a surface of the drift layer of the first conductivity type, base layers of a second conductivity type selectively formed in the surface of the high-resistance semiconductor layer, a plurality of island-shaped source layers of the first conductivity type formed to be arrayed almost parallel to a stripe direction of the drain layer in surfaces of the base layers of the second conductivity type, a gate electrode formed on the base layers of the second conductivity type between the source layers of the first conductivity type and the drift layer of the first conductivity type and between adjacent source layers of the first conductivity type via a gate insulating film, a drain electrode which contacts the drain layer, and source electrodes which contact both the source layers of the first conductivity type and the base layers of the second conductivity type.

In this manner, when the plurality of island-shaped source layers of the first conductivity type are to be formed, the drain layer is formed in the substantially stripe shape, like in the prior art. The source layers of the first conductivity type may be formed to be arrayed almost parallel to this stripe direction. By using this arrangement, the high-breakdown-voltage semiconductor device according to the present invention can be formed by slightly changing a conventional design.

According to the present invention, the third high-breakdown-voltage semiconductor device is characterized by comprising a substrate, an insulating film formed on the substrate, a high-resistance semiconductor layer formed on the insulating film, a drift layer of a first conductivity type selectively formed in a surface of the high-resistance semiconductor layer, a drain layer formed in a substantially stripe shape in a surface of the drift layer of the first conductivity type, base layers of a second conductivity type selectively formed in the surface of the high-resistance semiconductor layer, a plurality of island-shaped source layers of the first conductivity type arrayed and formed almost parallel to a stripe direction of the drain layer in surfaces of the base layers of the second conductivity type, a gate electrode formed on the base layers of the second conductivity type between the source layers of the first conductivity type and the drift layer of the first conductivity type and between adjacent source layers of the first conductivity type via a gate insulating film, a drain electrode which contacts the drain layer, and source electrodes which contact both the source layers of the first conductivity type and the base layers of the second conductivity type.

More specifically, a so-called SOI structure is applied in which the high-resistance semiconductor layer is formed on the insulating film formed on the substrate. With this structure, elements can be easily isolated from each other, and a very effective noise resistance can be attained. Note that, in this SOI structure, the drift layer of the first conductivity type is formed not to reach the insulating film.

In the high-breakdown-voltage semiconductor device according to the present invention, it is preferable in terms of a reduction in on-resistance without increasing the contact resistance that a condition $4.5\ \mu m \leq x+y \leq 100\ \mu m$ be satisfied where x is a length, in the stripe direction, of the gate electrode formed between the source layers of the first conductivity type, and y is a length of each of the source layers of the first conductivity type in the stripe direction.

Similarly, it is preferable in terms of a reduction in on-resistance without increasing the contact resistance that a condition $1.5\ \mu m \leq x \leq 4\ \mu m$ be satisfied where x is a length, in the stripe direction, of the gate electrode formed between the adjacent source layers of the first conductivity type.

The drift layer of the first conductivity type may also be formed between the base layers of the second conductivity type so as to contact the gate insulating film. In this case, the channel resistance at a portion between the adjacent base layers of the second conductivity type can be reduced, and a uniform channel and a uniform threshold voltage can be easily obtained between the source and the drain.

The drain layer may be of the first or second conductivity type. The high-breakdown-voltage semiconductor device according to the present invention is a high-breakdown-voltage MOSFET when the drain layer is of the first conductivity type, and a high-breakdown-voltage IGBT when the drain layer is of the second conductivity type.

According to the present invention, a high-breakdown-voltage semiconductor device may have an orthogonal interconnection structure in which the drain electrode comprises drain electrodes formed to be arrayed in a plurality of islands and which further comprises a lower source interconnection which does not contact the gate electrode and electrically connects the adjacent source electrodes via a portion above the gate electrode, an upper source interconnection which has a longitudinal direction perpendicular to the lower source interconnection and contacts an upper portion of the lower source interconnection above the gate electrode, a lower drain interconnection which does not contact each drain layer and electrically connects adjacent drain electrodes via a portion above the drain layer, and an upper drain interconnection which has a longitudinal direction perpendicular to the lower drain interconnection and contacts an upper portion of the lower drain interconnection above the drain layer.

Even if the orthogonal interconnection structure is formed, the on-resistance can be further reduced without increasing the wiring resistance, in addition to the effect of reducing the on-resistance by an element itself. Since the wiring resistance does not increase even if the orthogonal interconnection structure is formed, the high-breakdown-voltage semiconductor device is suitable for micropatterning and integration.

The above and other objects, the features, and the advantages of the present invention will be apparent from the following detailed description in conjunction with the accompanying drawings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a plan view showing the element structure of a high-breakdown-voltage MOSFET according to the first embodiment of the present invention;

FIG. 8 is a plan view showing the element structure of a high-breakdown-voltage MOSFET according to the second embodiment of the present invention;

FIG. 9A is a sectional view taken along the line IXA—IXA in FIG. 8;

FIG. 9B is a sectional view taken along the line IXB—IXB in FIG. 8;

FIG. 14 is a plan view showing the element structure of a high-breakdown-voltage MOSFET according to the fifth embodiment of the present invention;

FIG. 15 is a plan view showing the element structure of a high-breakdown-voltage MOSFET according to the sixth embodiment of the present invention;

FIG. 19 is a sectional view taken along the line XIX—XIX in FIG. 17;

FIG. 20 is a sectional view showing a modified arrangement in the seventh embodiment;

FIG. 23 is a plan view showing the structure of a high-breakdown-voltage MOSFET according to the eighth embodiment of the present invention.

DETAILED DESCRIPTION OF THE PREFERRED EMBODIMENTS

Embodiments of the present invention will be described below with reference to the accompanying drawings.

(First Embodiment)

Figure 1:
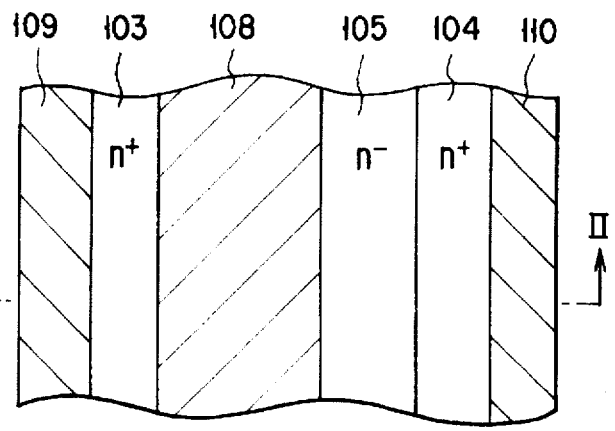
FIG. 1 is a plan view showing the element structure of a conventional high-breakdown-voltage MOSFET.
Figure 2:
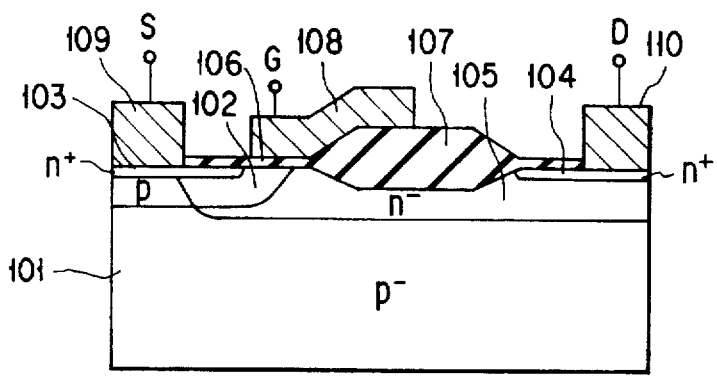
FIG. 2 is a sectional view taken along the line II—II in FIG. 1.
Figure 3:
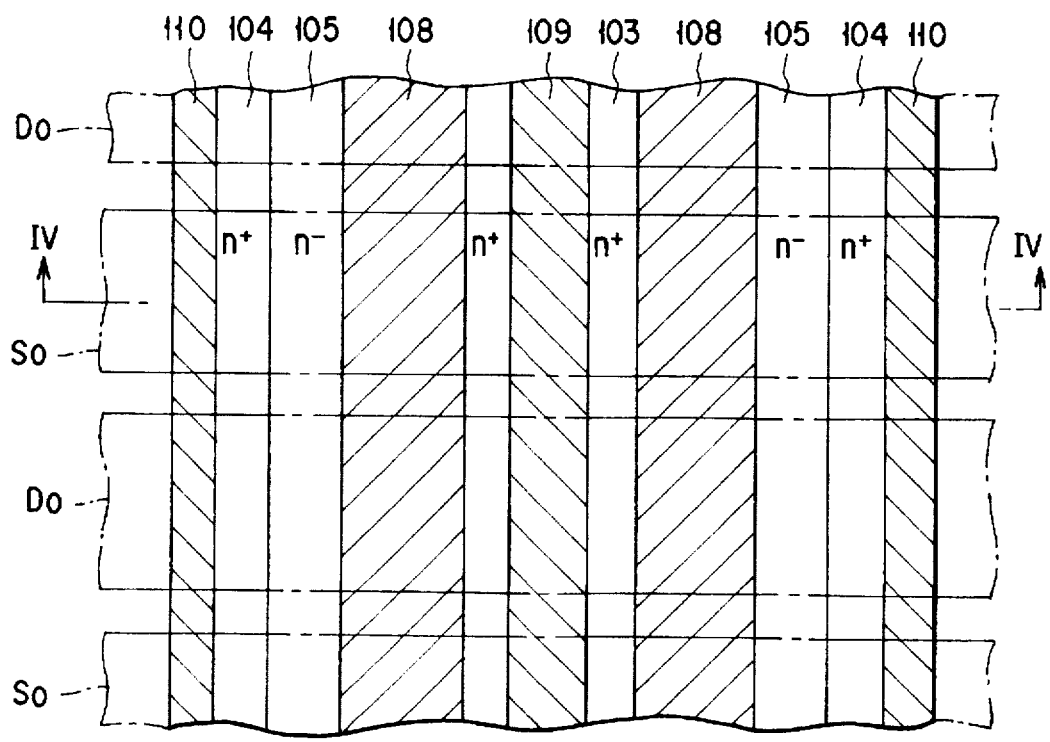
FIG. 3 is a plan view showing a structure wherein an orthogonal interconnection scheme is applied for the conventional high-breakdown-voltage MOSFET.
Figure 4:
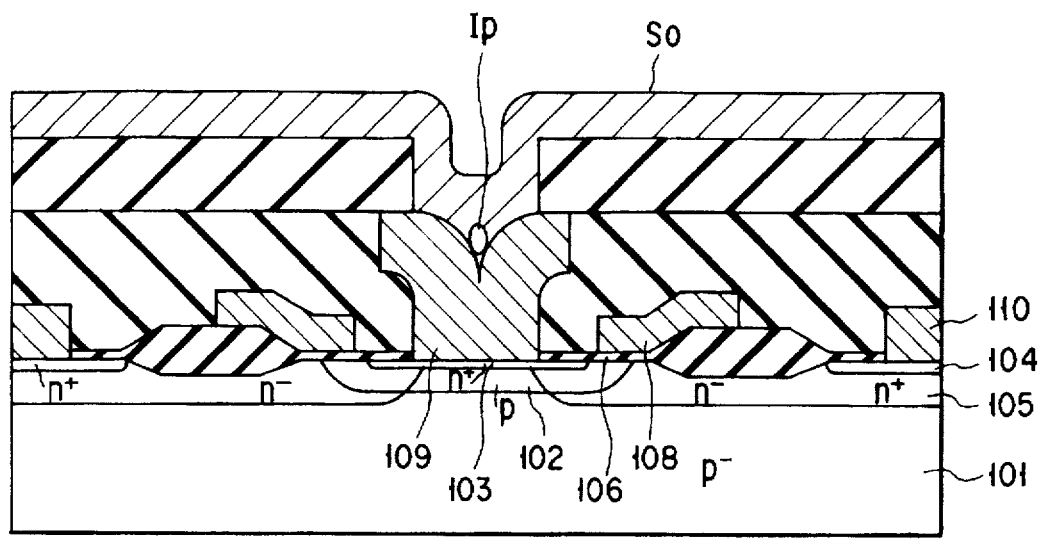
FIG. 4 is a sectional view taken along the line IV—IV in FIG. 3.
Figure 6A:
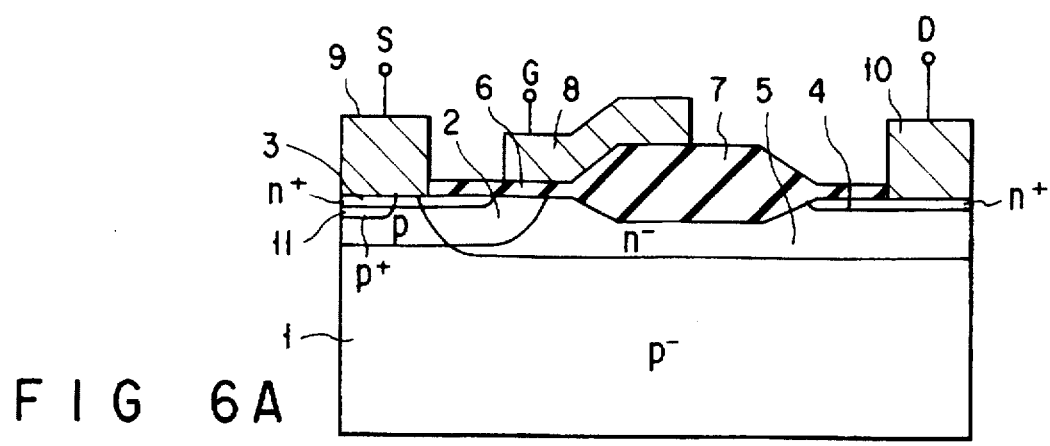
FIG. 6A is a sectional view taken along the line VIA—VIA in FIG. 5.
Figure 6B:
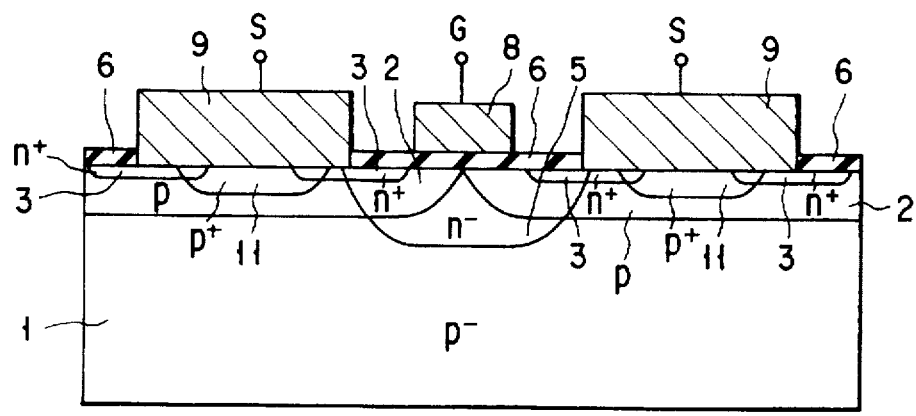
FIG. 6B is a sectional view taken along the line VIB—VIB in FIG. 5.

FIG. 5 is a plan view showing the element structure of a high-breakdown-voltage MOSFET according to the first embodiment of the present invention. FIG. 6A is a sectional view taken along the line VIA—VIA in FIG. 5, and FIG. 6B is a sectional view taken along the line VIB—VIB in FIG. 5. In this embodiment, the first conductivity type is an n type, and the second conductivity type is a p type, which also applies to the following embodiments.

Referring to these drawings, a p-type semiconductor layer 1 consists of a p-type Si substrate having a high resistance, and p-type base layers 2 are selectively formed to a thickness of about 1 μm in the surface of the p-type semiconductor layer 1. N-type source layers 3 are formed to have a low resistance and a thickness of about 0.3 μm in the surfaces of the p-type base layers 2. An n-type drain layer 4 is formed to have a low resistance and a thickness of about 0.3 μm in a substantially stripe shape in the surface of the p-type semiconductor layer 1 except for the p-type base layers 2. The n-type drain layer 4 is formed in an n-type drift layer 5 having a high resistance and a thickness of about 1.5 μm.

As shown in FIG. 6A, each gate electrode 8 is formed via a gate oxide film 6 and a field oxide film 7 on the surfaces of the p-type base layers 2 sandwiched between the n-type source layers 3 and the n-type drift layer 5 and on part, adjacent to this surface, of the surface of the n-type drift layer 5. A channel located below the gate electrode 8 and provided in the surface of each p-type base layer 2 sandwiched between the corresponding n-type source layer 3 and the n-type drift layer 5 has a length of about 0.7 μm.

Similarly, as shown in FIG. 6B, each gate electrode 8 is also formed on the surfaces of the p-type base layers 2 between the adjacent n-type source layers 3 via the gate oxide film 6. The gate electrode 8 has a length x of about 2 μm between the n-type source layers 3 in the stripe direction.

The n-type drift layer 5 is also formed between the n-type source layers 3. A source electrode 9 is formed on each n-type source layer 3. A drain electrode 10 is formed on the n-type drain layer 4. Further, a p-type contact layer 11 having a low resistance is formed below the center of each source electrode 9 in order to attain a good contact.

Since an excessively large channel length increases the on-resistance, the thickness of the p-type base layer 2 formed by double diffusion is preferably about 1.5 μm.

The characteristic feature of this high-breakdown-voltage MOSFET is that the n-type source layers 3 in the surfaces of the p-type base layers 2 are formed into a plurality of rectangular or square islands, and the island-shaped n-type source layers 3 are formed to be arrayed almost parallel to the stripe direction of the striped n-type drain layer 4.

Since the n-type source layers 3 are formed to be arrayed in an island shape in this high-breakdown-voltage MOSFET, the gate electrode 8 can be formed between the adjacent n-type source layers 3, and channels can also be formed in the surfaces of the p-type base layers 2 between the n-type source layers 3, as shown in FIG. 6B. Therefore, the effective channel width becomes larger than that of a conventional MOSFET, and the on-resistance can be greatly reduced.

Next, conditions for increasing the channel width required to reduce the on-resistance will be described. To increase the channel width, it is important to define lengths x, y, and z shown in FIG. 5. Note that x is the length of the gate electrode corresponding to an interval between the adjacent n-type source layers 3, y is the length, in the stripe direction, of each n-type source layer 3 surrounded by the gate electrode 8, and z is the length of the gate electrode in a direction perpendicular to x and corresponds to the width between the adjacent n-type source layers 3.

It is preferable to define x, y, and z as expressed by the following equations (1) to (5) in terms of a reduction in on-resistance.

$$4.5\ \mu m \leq x+y \leq 100\ \mu m \quad (1)$$

$$1.5 \leq m \leq x \leq 4\ \mu m \quad (2)$$

$$3\ \mu m \leq y \leq 98.5\ \mu m \quad (3)$$

$$3\ \mu m \leq z \leq 6\ \mu m \quad (4)$$

$$x < z \quad (5)$$

If one pitch (x+y) constituted by the length x of the gate electrode 8 and the length y of the n-type source layer 3 is larger than 100 μm, the source electrodes 9 according to the present invention are undesirably changed from the island shape to a substantially conventional stripe shape. For this reason, the on-resistance becomes almost equal to a conventional value, and the reduction amount of the on-resistance according to the present invention undesirably falls within the range of a manufacturing error. Therefore, x+y is preferably 100 μm or less (x+y≤100 μm . . . the maximum value of condition (1)).

If the length x is smaller than 1.5 μm, the channel width at the portion x becomes small, and the channel resistance is high. The length x is preferably 1.5 μm or more. If the length x exceeds 4 μm, the number of source electrodes 9 per unit area decreases. As a result, the contact area of each source electrodes 9 decreases to increase the contact resistance. Therefore, the length x is preferably 4 μm or less (1.5 μm≤x≤4 μm . . . condition (2)).

Further, if the length y is smaller than 3 μm, the contact area of the source electrode 9 also decreases to increase the contact resistance. The length y is preferably 3 μm or more. Since x+y is preferably 100 μm or less, and the x is preferably 1.5 μm or more, the length y is preferably 98.5 μm or less (3 μm≤y≤98.5 μm . . . condition (3)).

Since the length y is preferably 3 μm or more, and the length x is preferably 1.5 μm or more, x+y is preferably 4.5 μm or more (4.5 μm≤x+y . . . the minimum value of condition (1)).

In addition to this, if the length z exceeds 3 μm, the contact resistance increases. The length z is preferably 3 μm or more. If the length z exceeds 6 μm, the on-resistance increases. The length z is preferably 6 μm or less (3 μm≤z≤6 μm . . . condition (4)).

In the present invention, a length represented by the length z is defined by the gate electrode 8 to increase the channel width. If x is larger than z in comparison of x with z, the channel width according to the present invention is not increased, compared to a conventional channel width. Therefore, it is preferable to set z larger than x (x<z . . . condition (5)).

As described above, according to the definitions of conditions (1) to (5), the effective channel width can be increased without increasing the on-resistance in the high-breakdown-voltage MOSFET according to this embodiment. Therefore, the on-resistance can be easily and reliably reduced.

Since the area of the gate electrode 8 in this high-breakdown-voltage MOSFET is larger than that of the conventional MOSFET, the gate resistance can be reduced to increase the switching speed.

Figure 7:
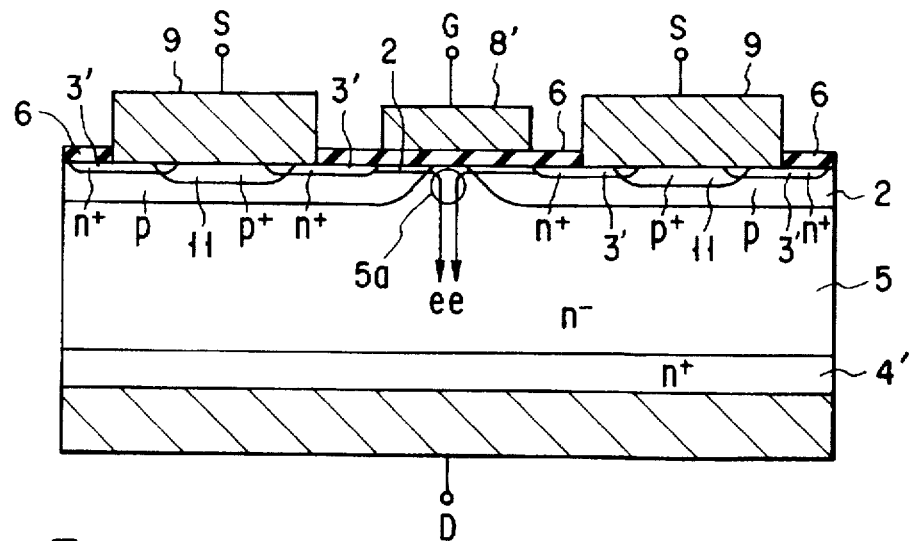
FIG. 7 is a schematic view showing a problem of a vertical MOSFET to explain the effect of this embodiment.

Further, condition (2), which defines an interval between the n-type source layers 3 to 4 μm or less, represents that the high-breakdown-voltage MOSFET according to the present invention is micropatterned finer than a vertical MOSFET. In the vertical MOSFET, as shown in FIG. 7, an interval between adjacent n-type source layers 3' must be set at 5 μm or more in order to prevent an electron current of electrons injected from the n-type source layers 3' from concentrating on a portion 5a immediately below a gate electrode 8; so that heat may not be generated and the MOSFET may not have its resistance increased. That is, the high-breakdown-voltage MOSFET according to the present invention is more suitable for micropatterning than the vertical MOSFET and can be manufactured at a high integration degree.

(Second Embodiment)

Next, a high-breakdown-voltage MOSFET according to the second embodiment of the present invention will be described.

FIG. 8 is a plan view showing the element structure of this high-breakdown-voltage MOSFET. FIG. 9A is a sectional view taken along the line IXA—IXA in FIG. 8, and FIG. 9B is a sectional view taken along the line IXB—IXB in FIG. 8. The same reference numerals as in FIGS. 5, 6A, and 6B denote the same parts in FIGS. 8, 9A, and 9B, a detailed description thereof will be omitted, and only a different part will be described, which also applies to the following embodiments.

More specifically, as shown in FIG. 9B, adjacent p-type base layers 2 are formed spaced apart from each other, unlike in the first embodiment. An n-type drift layer 5 is formed to be exposed in a surface between the respective p-type base layers 2.

With this structure, the channel resistance at this portion can be reduced. Since the adjacent p-type base layers 2 are spaced apart so as not to overlap each other, a uniform channel and a uniform threshold voltage can be easily obtained at the portion shown in FIG. 9A.

As described above, according to the second embodiment, the channel resistance at the portion between the adjacent p-type base layers 2 can be reduced, and uniform channels between sources and a drain and uniform threshold voltages can be easily obtained, in addition to the effect of the first embodiment.

(Third Embodiment)

Next, a high-breakdown-voltage MOSFET according to the third embodiment of the present invention will be described.

Figure 10:
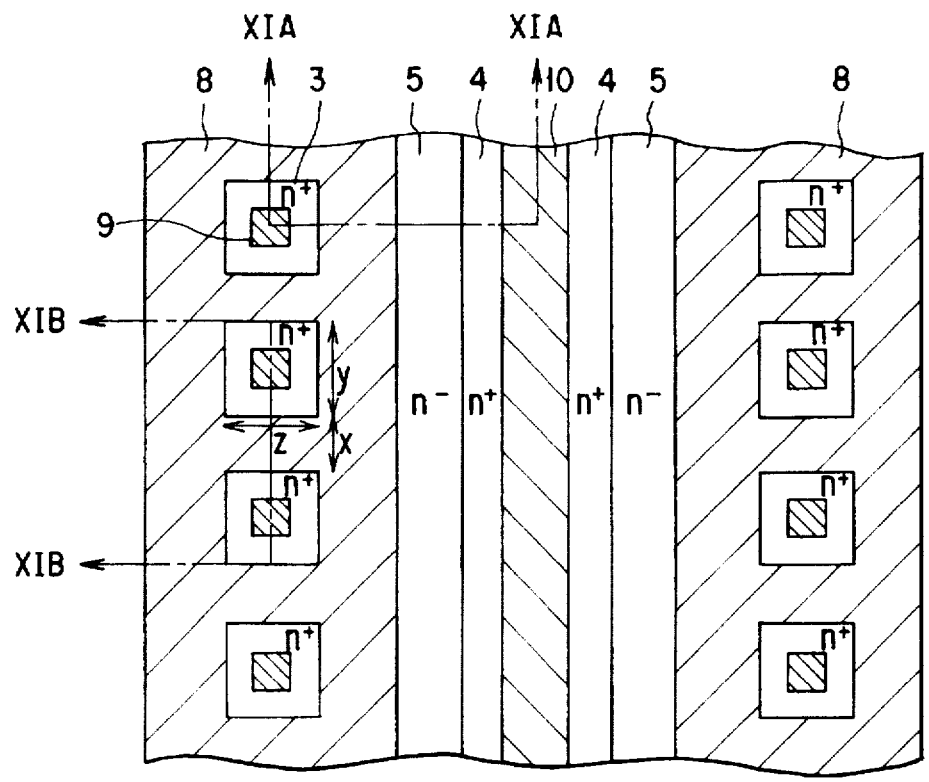
FIG. 10 is a plan view showing the element structure of a high-breakdown-voltage MOSFET according to the third embodiment of the present invention.
Figure 11A:
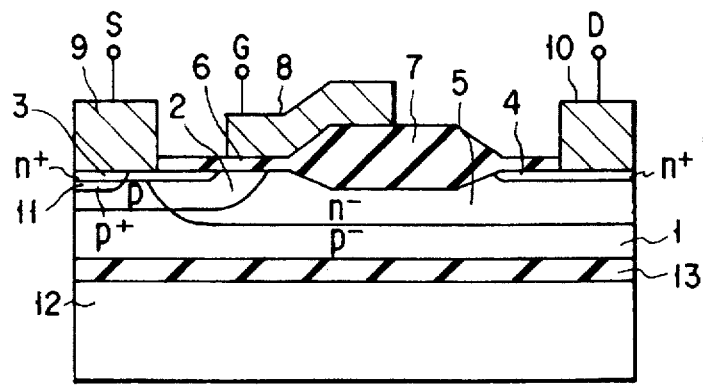
FIG. 11A is a sectional view taken along the line XIA—XIA in FIG. 10.
Figure 11B:
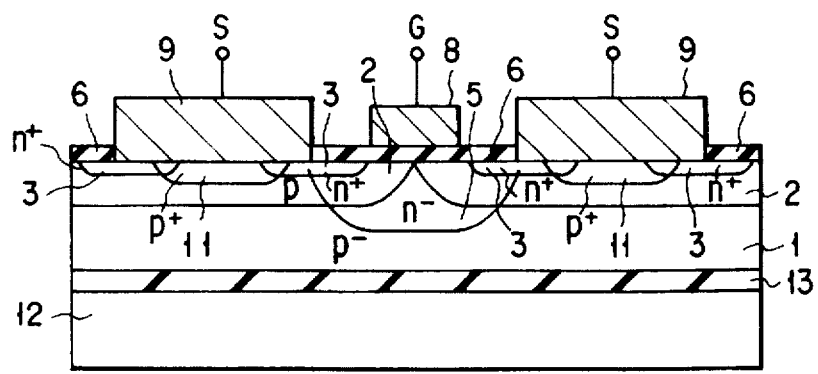
FIG. 11B is a sectional view taken along the line XIB—XIB in FIG. 10.

FIG. 10 is a plan view showing the element structure of this high-breakdown-voltage MOSFET. FIG. 11A is a sectional view taken along the line XIA—XIA in FIG. 10, and FIG. 11B is a sectional view taken along the line XIB—XIB in FIG. 10.

The high-breakdown-voltage MOSFET according to this embodiment is realized by a so-called SOI (Silicon On Insulator) structure having a p-type semiconductor layer 1 on an oxide film 13 with a thickness of about 0.5 μm formed on a p-type Si substrate 12, unlike in the first embodiment.

In this case, the thickness of the p-type semiconductor layer 1 is set to about 2 to 5 μm, to and an n-type drift layer 5 does not reach the oxide film 13. Therefore, it is desirable that the thickness of the n-type drift layer 5 be 1.5 μm or less. In terms of ensuring a high breakdown voltage of an element, the thickness of the n-type drift layer 5 is preferably 0.8 μm or more.

Since the high-breakdown-voltage MOSFET according to this embodiment is formed with such an SOI structure, elements can be easily isolated from each other, and a sufficient noise resistance can be attained.

Figure 12:
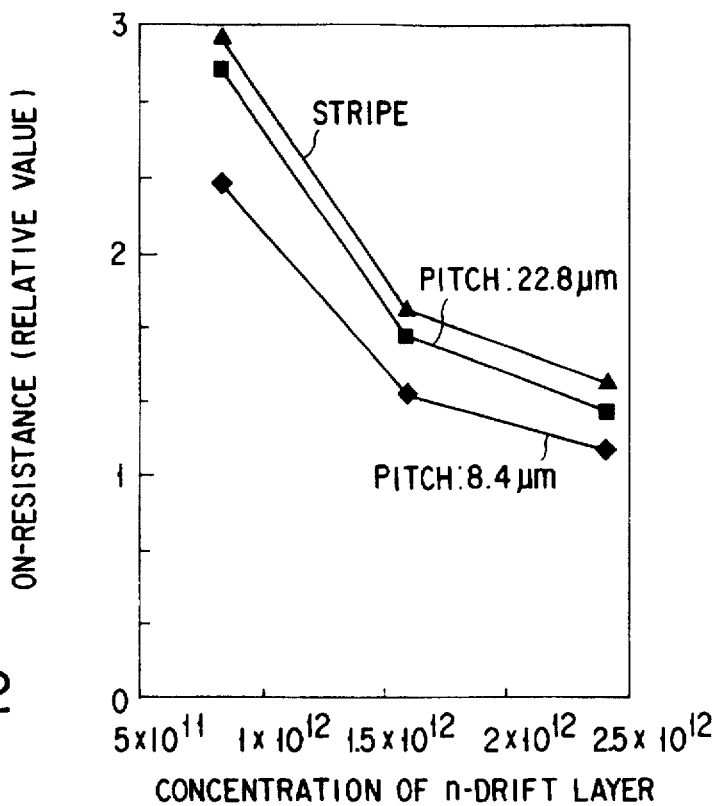
FIG. 12 is a graph showing the experimental comparison results of the on-resistance of the high-breakdown-voltage MOSFET in this embodiment and that of the conventional high-breakdown-voltage MOSFET.

Next, the relationship between one pitch represented by x+y described above and the on-resistance in the high-breakdown-voltage MOSFET having this SOI structure will be explained with reference to FIG. 12. In FIG. 12, the abscissa indicates the impurity concentration of the n-type drift layer 5, and the ordinate indicates the relative value of the on-resistance. In addition, FIG. 12 shows comparison between the use of 8.4 μm as one pitch, the use of 22.8 μm as one pitch, and the use of stripe source layers 3 similar to the prior art. Note that x=2 μm and y=6.4 μm for one pitch of 8.4 μm, and x=2 μm and y=20.8 μm for one pitch of 22.8 μm.

As is apparent from FIG. 12, the on-resistance is reduced in proportion to an increase in impurity concentration of the n-type drift layer 5 or a decrease in pitch. More specifically, the on-resistance for one pitch of 22.8 μm is about 8% lower than that for the striped source layers 3, and the on-resistance for one pitch of 8.4 μm is about 20% lower.

Although not shown, the on-resistance is reduced by about 5% for x=2 μm, y=38 μm, and one pitch of 40 μm. Further, the on-resistance is reduced by about 2% for x=2 μm, y=98 μm, and one pitch of 100 μm. If one pitch exceeds 100 μm, the on-resistance becomes almost equal to the conventional value. As described above, the definition of condition (1) is derived. The remaining definitions of conditions (2) to (5) are also derived.

That is, the high-breakdown-voltage MOSFET according to this embodiment preferably follow the definitions represented by conditions (1) to (5), similar to the first embodiment.

As described above, according to the third embodiment, elements can be easily isolated by the SOI structure, and a sufficient noise resistance can be attained, in addition to the effect of the first embodiment.

(Fourth Embodiment)

Next, a high-breakdown-voltage MOSFET according to the fourth embodiment of the present invention will be described with reference to FIG. 10.

Figure 13A:
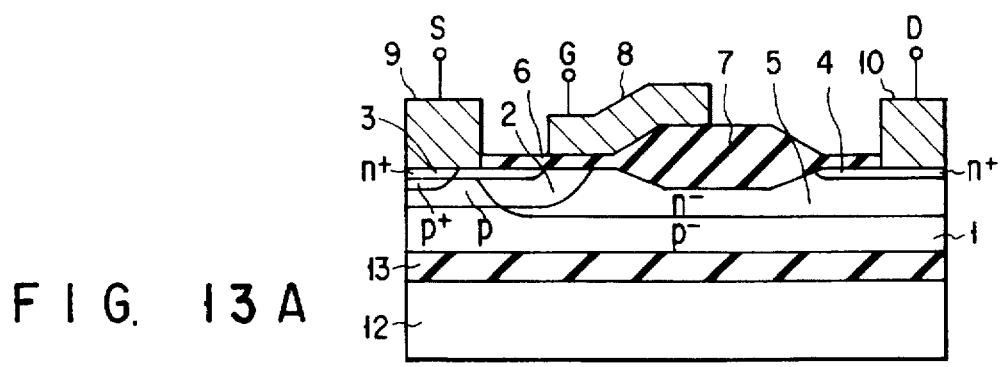
FIG. 13A is a sectional view showing the element structure of a high-breakdown-voltage MOSFET according to the fourth embodiment of the present invention.
Figure 13B:
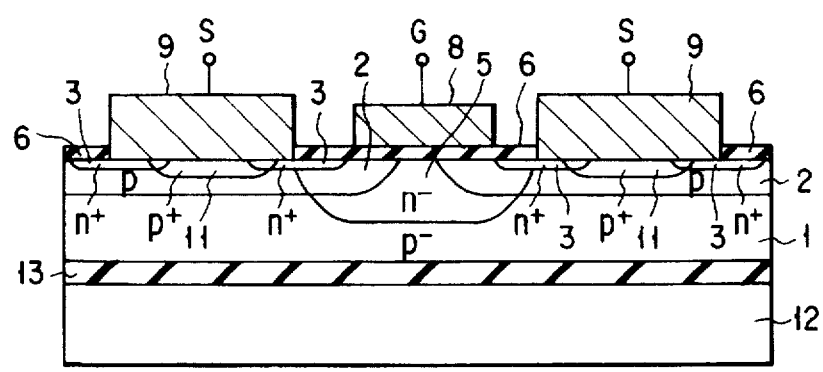
FIG. 13B is a sectional view showing the element structure of the high-breakdown-voltage MOSFET according to this embodiment.

More specifically, the high-breakdown-voltage MOSFET according to this embodiment is a combination of the second and third embodiments. This high-breakdown-voltage MOSFET has the planar arrangement shown in FIG. 10 and in addition an SOI structure shown in FIGS. 13A and 13B in place of the SOI structure shown in FIGS. 11A and 11B. Adjacent p-type base layers 2 are formed spaced apart from each other, and an n-type drift layer 5 is formed to be exposed in a surface between the respective p-type base layers 2.

With this arrangement, the effects of the second and third embodiments can be simultaneously obtained.

(Fifth Embodiment)

Next, a high-breakdown-voltage MOSFET according to the fifth embodiment of the present invention will be described with reference to the sectional views of FIGS. 6A and 6B. FIG. 14 is a plan view showing the element structure of this high-breakdown-voltage MOSFET.

More specifically, the high-breakdown-voltage MOSFET according to this embodiment has a modified arrangement of the first embodiment. As shown in FIG. 14, island-shaped drain electrodes 10 are formed to oppose source electrodes 9.

With the above arrangement, the same effect as that of the first embodiment can be obtained.

If the high-breakdown-voltage MOSFET having the planar arrangement shown in FIG. 14 is modified into an element having a sectional structure according to any one of the second to fourth embodiments in place of the sectional structure of FIGS. 6A and 6B, the same effect as that of the corresponding embodiment can be obtained. Note that the drain electrodes 10 have an island shape in any modified arrangement.

(Sixth Embodiment)

Figure 16:
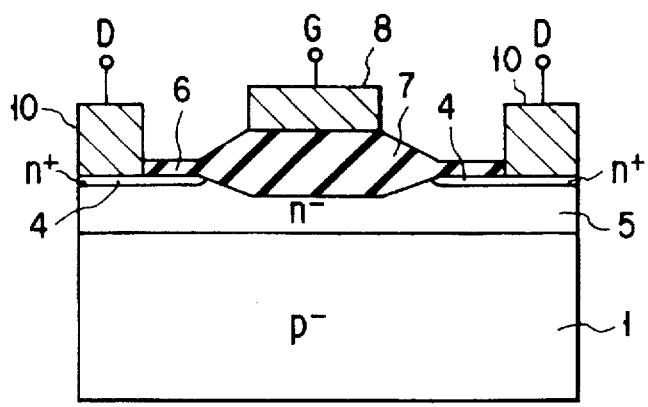
FIG. 16 is a sectional view taken along the line XVI—XVI in FIG. 15.

Next, a high-breakdown-voltage MOSFET according to the sixth embodiment of the present invention will be described with reference to the sectional views of FIGS. 6A and 6B. FIG. 15 is a plan view showing the element structure of this high-breakdown-voltage MOSFET, and FIG. 16 is a sectional view taken along the line XVI—XVI in FIG. 15.

More specifically, the high-breakdown-voltage MOSFET according to this embodiment has a modified arrangement of the first embodiment. As shown in FIGS. 15, 16, 6A, and 6B, island-shaped drain electrodes 10 are formed to oppose source electrodes 9. A gate electrode is formed in a mesh-like shape so as to surround n-type drift layers 4 and an n-type drain layer 5 around the island-shaped drain electrodes 10.

With the above arrangement, the same effect as that of the first embodiment can be obtained. Further, since the area of gate electrode 8 can be increased, the switching speed can be increased.

Even if the high-breakdown-voltage MOSFET according to this embodiment is modified into an element having a sectional structure according to any one of the second to fourth embodiments instead of the sectional structure shown in FIGS. 6A and 6B, the same effect as that of the corresponding embodiment can be obtained. Further, the switching speed can be increased, as described above.

(Seventh Embodiment)

Next, a high-breakdown-voltage MOSFET according to the seventh embodiment of the present invention will be described.

Figure 17:
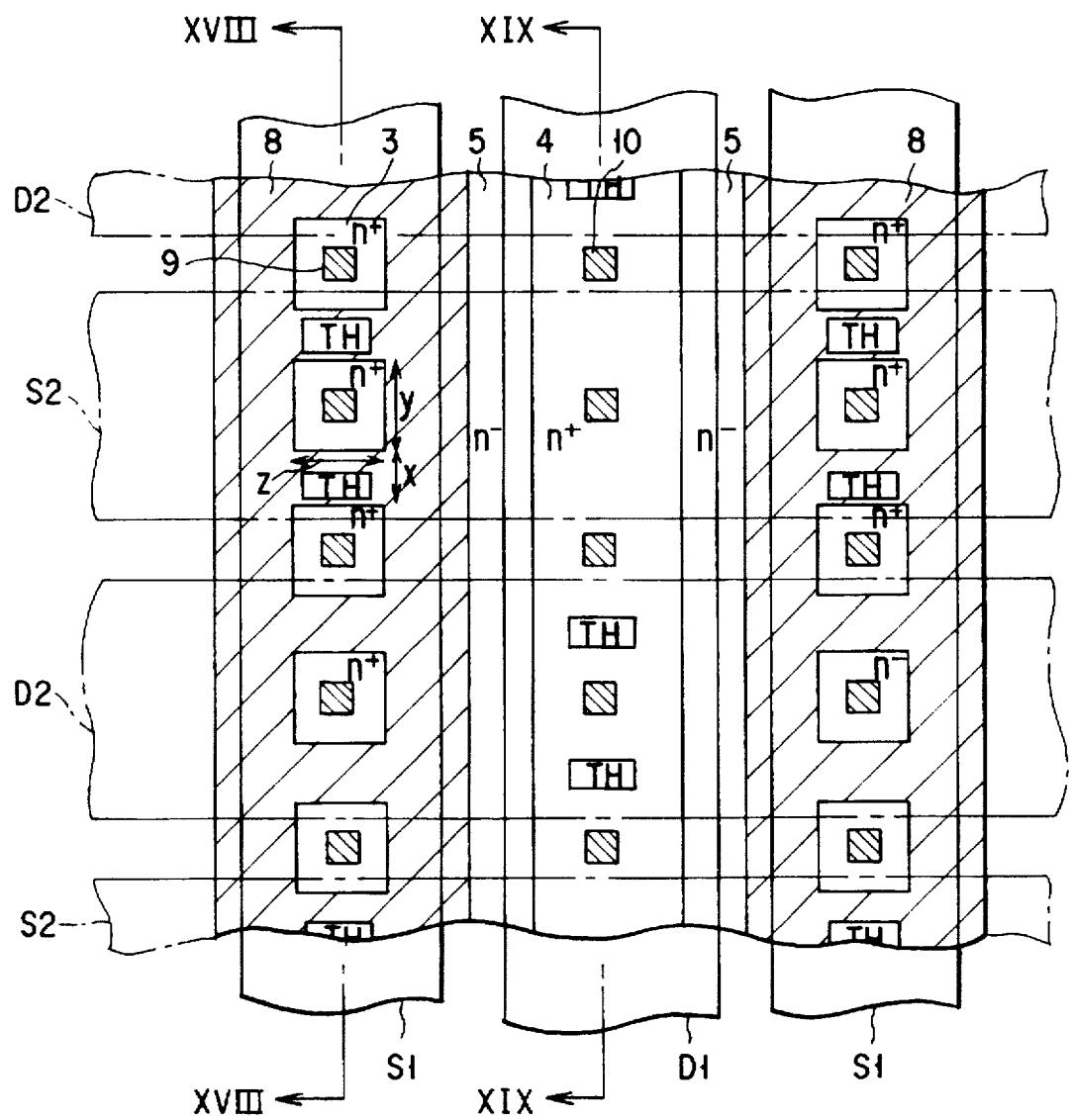
FIG. 17 is a plan view showing the structure of a high-breakdown-voltage MOSFET according to the seventh embodiment of the present invention.
Figure 18:
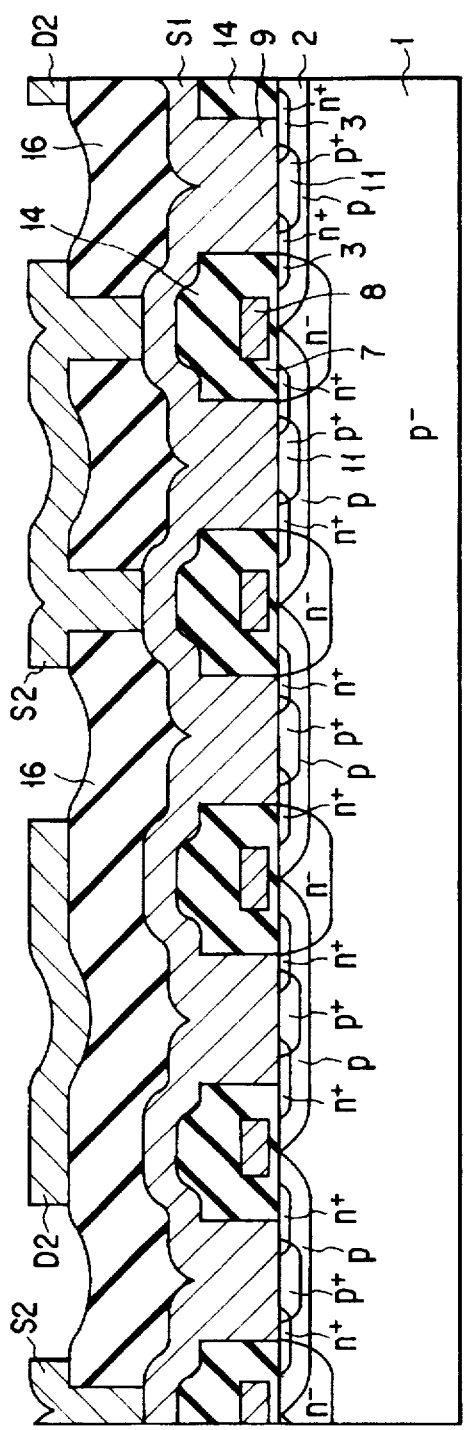
FIG. 18 is a sectional view taken along the line XVIII—XVIII in FIG. 17.

FIG. 17 is a plan view showing the structure of this high-breakdown-voltage MOSFET, and FIG. 18 is a sectional view taken along the line XVIII—XVIII in FIG. 17. FIG. 19 is a sectional view taken along the line XIX—XIX in FIG. 17.

That is, the high-breakdown-voltage MOSFET according to this embodiment has an arrangement wherein two-level interconnections are formed on the high-breakdown-voltage MOSFET according to the fifth embodiment.

More specifically, as shown in FIGS. 17 to 19, the high-breakdown-voltage MOSFET comprises an insulating film 14, a lower source interconnection S1, an upper source interconnection S2, an insulating film 15, a lower drain interconnection D1, and an upper drain interconnection D2. The insulating film 14 covers a gate electrode 8. The lower source interconnection S1 contacts the upper portion of the insulating film 14 above the gate electrode 8 so as to be insulated from the gate electrode 8. The lower source interconnection S1 electrically connects adjacent source electrodes 9. The upper source interconnection S2 has a longitudinal direction perpendicular to the lower source interconnection S1. The upper source interconnection S2 contacts the upper portion of the lower source interconnection S1 at a portion above the gate electrode 8. The insulating film 15 covers an n-type drain layer around respective drain electrodes 10. The lower drain interconnection D1 contacts the insulating film 15 on an n-type drain layer 4 so as to be insulated from the n-type drain layer 4. The lower drain interconnection D1 electrically connects the adjacent drain electrodes 10. The upper drain interconnection D2 has a longitudinal direction perpendicular to the lower drain interconnection D1. The upper drain interconnection D2 contacts the upper portion of the lower drain interconnection D1 above the n-type drain layer 4.

Note that insulating interlayers 16 are formed between the lower interconnections S1 and D1 and the upper interconnections S2 and D2. Al is used for the interconnections S1, S2, D1, and D2.

The lower source interconnection S1 and the lower drain interconnection D1 are designed to have substantially the same width. For example, they respectively have a width of 5 μm and are formed to be alternately arrayed parallel to each other at an interval of 1 μm.

The source electrodes 9 connected to the lower source interconnection S1 have different lengths in the stripe direction in accordance with the above-described pitch x+y. The smallest source electrode 9 has an area of about 1×1 μm. The drain electrodes 10 also have different lengths, and the smallest drain electrode 10 has an area of about 1×1 μm.

Through holes (TH) connecting the lower source interconnection S1 to the upper source interconnection S2 have different lengths in the stripe direction in accordance with the pitch x+y. The smallest through hole has an area of about 1.6×1.6 μm. Through holes connecting the lower drain interconnection D1 to the upper drain interconnection D2 also have different sizes, and the smallest through hole has an area of about 1.6×1.6 μm.

The upper source interconnection S2 and the p-type base layers 2 have different sizes in accordance with the pitch x+y. For example, they have a width of 10 to 20 μm each.

The characteristic feature of this high-breakdown-voltage MOSFET is that an orthogonal interconnection structure is realized such that the through holes defined by the lower and upper source interconnections S1 and S2 do not overlap contact holes defined by the lower source interconnection S1 and n-type source layers 3. Note that an orthogonal interconnection structure is also realized in which the through holes defined by the lower and upper drain interconnections D1 and D2 do not overlap contact holes defined by the lower drain interconnection D1 and the n-type drain layer 4.

The source side of such an orthogonal interconnection structure is realized as follows. The island-shaped source electrodes 9 are formed in the stripe direction together with the lower source interconnection S1. The lower source interconnection S1 is made flat between the respective source electrodes 9 to allow the flat portions to contact the upper source interconnection S2. The drain side is similarly formed.

With this orthogonal interconnection structure, the contact area (areas of through holes) between the lower and upper source interconnections S1 and S2 per unit area can be increased without decreasing the areas of the source electrodes 9 (areas of contact holes). Therefore, the on-resistance of the element can be reduced without increasing the wiring resistance, unlike in the prior art.

Similarly, the contact area (areas of through holes) between the lower and upper drain interconnections D1 and D2 per unit area can be increased without decreasing the areas of the drain electrodes 10 (areas of contact holes). Therefore, the on-resistance of the element can be reduced without increasing the wiring resistance, unlike in the prior art.

As described above, according to the seventh embodiment, the two-level orthogonal interconnection structure capable of reducing the on-resistance of the element without increasing the wiring resistance can be realized, in addition to the effect of the fifth embodiment. That is, a high-breakdown-voltage MOSFET which has both a low on-resistance and a low wiring resistance and is suitable for micropatterning and integration can be realized.

Figure 21:
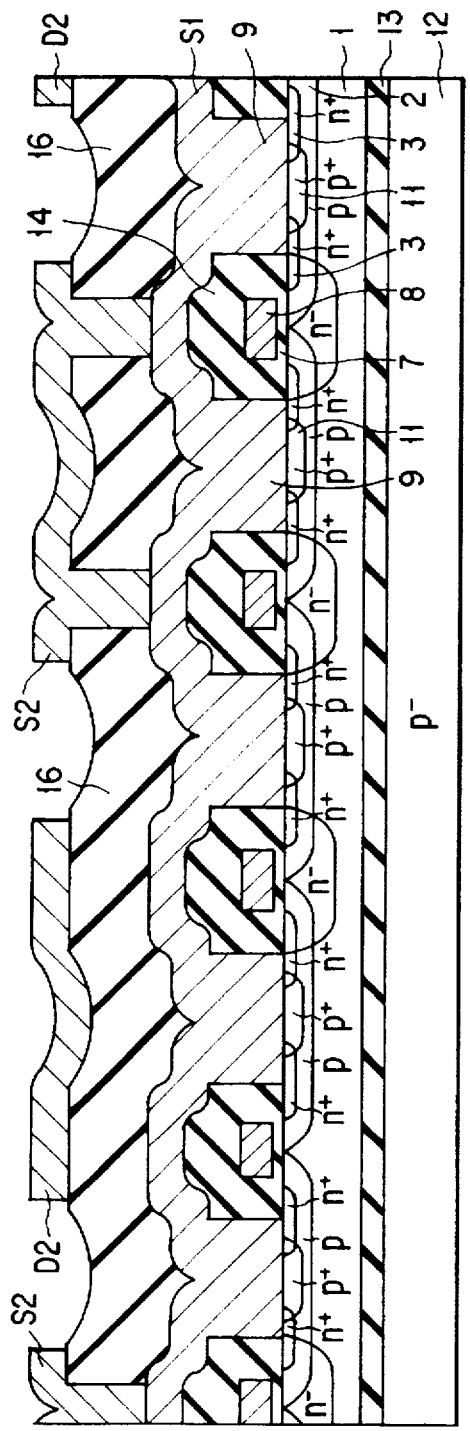
FIG. 21 is a sectional view showing another modified arrangement in the seventh embodiment.
Figure 22:
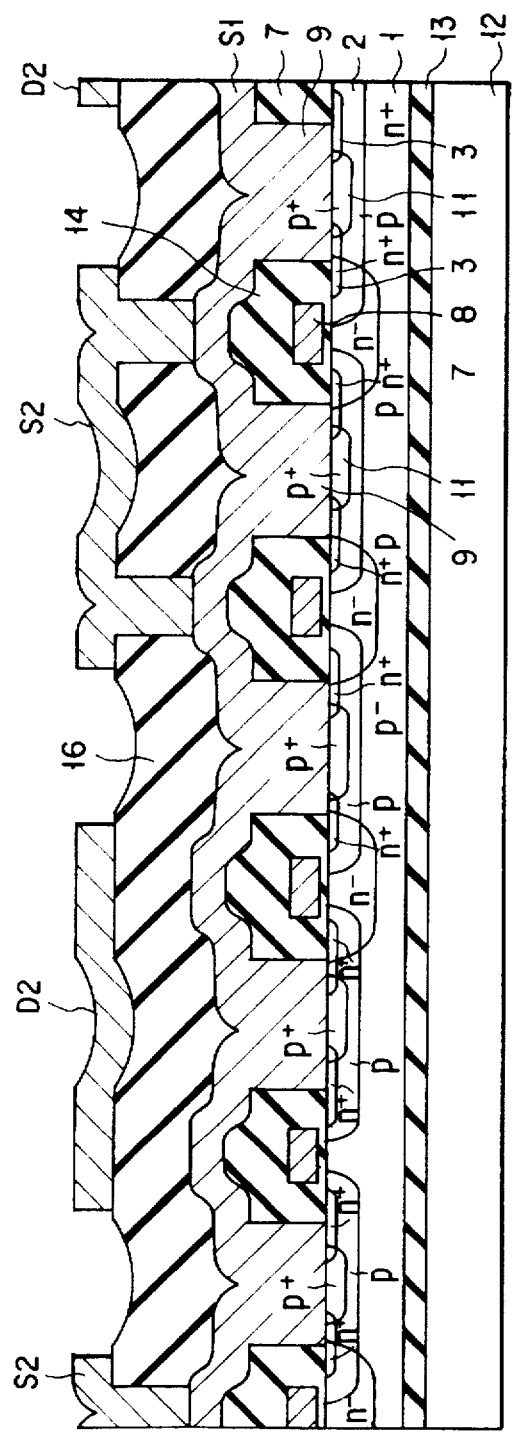
FIG. 22 is a sectional view showing still another modified arrangement in the seventh embodiment.

If the high-breakdown-voltage MOSFET according to this embodiment is modified into a device having a sectional structure shown in any one of FIGS. 20 to 22, instead of the sectional structure of FIG. 18, by applying the orthogonal interconnection scheme for an element corresponding to any one of the second to fourth embodiments, the same effect as that of any one of the second to fourth embodiments can be obtained, in addition to the effect of this embodiment. Even in any modified arrangement, the drain electrodes 10 have an island shape. If the high-breakdown-voltage MOSFET is modified to have an SOI structure shown in FIG. 21 or 22, the sectional structure in FIG. 19 is also modified into an SOI structure though not shown.

(Eighth Embodiment)

Next, a high-breakdown-voltage MOSFET according to the eighth embodiment of the present invention will be described with reference to FIG. 18.

Figure 24:
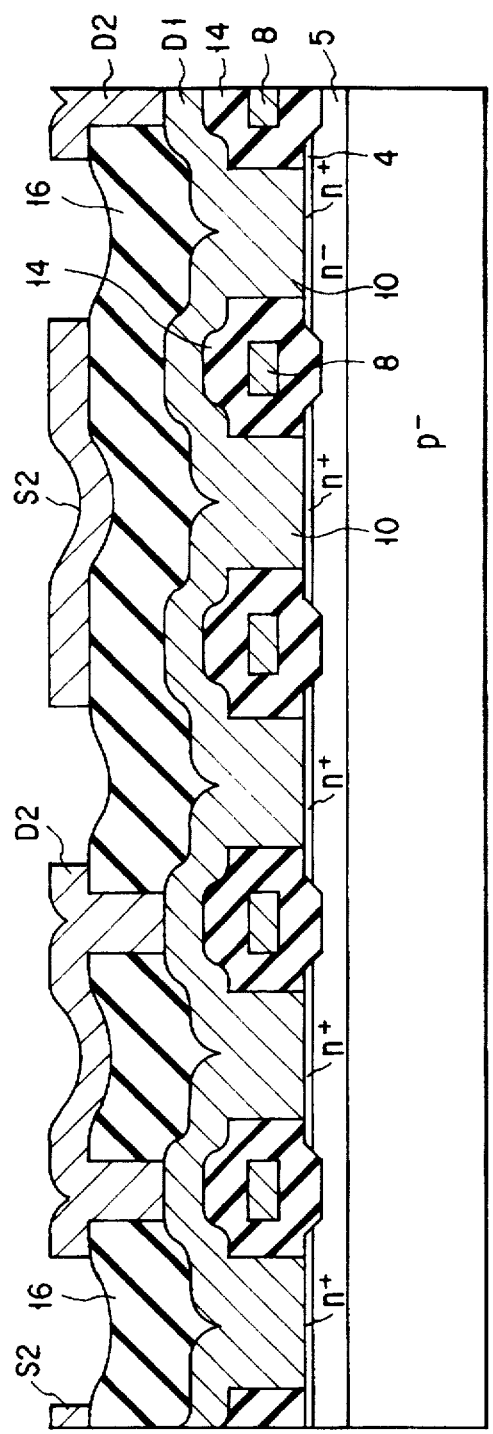
FIG. 24 is a sectional view taken along the line XXIV—XXIV in FIG. 23.

FIG. 23 is a plan view showing the structure of this high-breakdown-voltage MOSFET, and FIG. 18 is a sectional view taken along the line XVIII—XVIII in FIG. 23. FIG. 24 is a sectional view taken along the line XXIV—XXIV in FIG. 23.

As shown in FIG. 23 and the like, the high-breakdown-voltage MOSFET according to this embodiment has an arrangement wherein the two-level interconnections according to the seventh embodiment are formed on the high-breakdown-voltage MOSFET according to the sixth embodiment.

With this arrangement, the effects of the sixth and seventh embodiments can be simultaneously obtained.

If the high-breakdown-voltage MOSFET according to this embodiment is modified into a device having a sectional structure shown in any one of FIGS. 20 to 22, instead of the sectional structure of FIG. 18, by applying the orthogonal interconnection scheme for an element corresponding to any one of the second to fourth embodiments, the same effect as that of any one of the second to fourth embodiments can be obtained, in addition to the effect of this embodiment. Even with any modified arrangement, the high-breakdown-voltage MOSFET has the planar structure shown in FIG. 23. If the high-breakdown-voltage MOSFET is modified to have the SOI structure shown in FIG. 21 or 22, the sectional structure shown in FIG. 24 is also modified into an SOI structure though not shown.

(Another Embodiment)

The embodiments of the present invention have been described above. However, the present invention is not limited to the above embodiments. For example, a buffer layer may be arranged between the n-type drain layer 4 and the n-type drift layer 5. Although the above embodiments exemplify the case of forming the MOSFET with the n-type drain layer 4, an IGBT (Insulated Gate Bipolar Transistor) may be formed by using a p-type drain layer 4.

The conductivity types of semiconductor layers may be set reverse to those in the respective embodiments to constitute a MOSFET using a p type as the first conductivity type and an n type as the second conductivity type. Further, the conductivity type of the drain layer of this MOSFET is set reverse to form an IGBT constituted by semiconductor layers whose conductivity types are reverse to those of the above-described IGBT.

Various modifications are deemed without departing from the spirit and scope of the present invention.

What is claimed is:

1. A high-breakdown-voltage semiconductor device comprising:

a high-resistance semiconductor layer;

a drift layer of a first conductivity type selectively formed in a surface of said high-resistance semiconductor layer;

a drain layer formed in a surface of said drift layer of the first conductivity type;

base layers of a second conductivity type selectively formed in said surface of said high-resistance semiconductor layer;

a plurality of island-shaped source layers of the first conductivity type formed in surfaces of said base layers of the second conductivity type;

a gate electrode formed entirely on said base layers of the second conductivity type between said source layers of the first conductivity type and said drift layer of the first conductivity type and between adjacent source layers of the first conductivity type via a gate insulating film;

a drain electrode which contacts said drain layer; and source electrodes which contact both said source layers of the first conductivity type and said base layers of the second conductivity type.

2. A high-breakdown-voltage semiconductor device comprising:

a high-resistance semiconductor layer;

a drift layer of a first conductivity type selectively formed in a surface of said high-resistance semiconductor layer;

a drain layer formed in a substantially stripe shape in a surface of said drift layer of the first conductivity type;

base layers of a second conductivity type selectively formed in said surface of said high-resistance semiconductor layer;

a plurality of island-shaped source layers of the first conductivity type formed to be arrayed almost parallel to a stripe direction of said drain layer in surfaces of said base layers of the second conductivity type;

a gate electrode formed entirely on said base layers of the second conductivity type between said source layers of the first conductivity type and said drift layer of the first conductivity type and between adjacent source layers of the first conductivity type via a gate insulating film;

a drain electrode which contacts said drain layer; and source electrodes which contact both said source layers of the first conductivity type and said base layers of the second conductivity type.

3. A high-breakdown-voltage semiconductor device comprising:

a substrate;

an insulating film formed on said substrate;

a high-resistance semiconductor layer formed on said insulating film;

a drift layer of a first conductivity type selectively formed in a surface of said high-resistance semiconductor layer;

a drain layer formed in a substantially stripe shape in a surface of said drift layer of the first conductivity type;

base layers of a second conductivity type selectively formed in said surface of said high-resistance semiconductor layer;

a plurality of island-shaped source layers of the first conductivity type arrayed and formed almost parallel to a stripe direction of said drain layer in surfaces of said base layers of the second conductivity type;

a gate electrode formed entirely on said base layers of the second conductivity type between said source layers of the first conductivity type and said drift layer of the first conductivity type and between adjacent source layers of the first conductivity type via a gate insulating film;

a drain electrode which contacts said drain layer; and source electrodes which contact both said source layers of the first conductivity type and said base layers of the second conductivity type.

4. A device according to claim 1, wherein, when said plurality of source layers of the first conductivity type are formed linearly in a predetermined array direction, a condition $4.5 \ \mu m \leq x+y \leq 100 \ \mu m$ is satisfied where x is a length, in the array direction, of said gate electrode formed between said adjacent source layers of the first conductivity type, and y is a length of each of said source layers of the first conductivity type in the array direction.

5. A device according to claim 2, wherein a condition $4.5 \ \mu m \leq x+y \leq 100 \ \mu m$ is satisfied where x is a length, in the stripe direction, of said gate electrode formed between said source layers of the first conductivity type, and y is a length of each of said source layers of the first conductivity type in the stripe direction.

6. A device according to claim 3, wherein a condition 4.5 µm≦x+y≦100 µm is satisfied where x is a length, in the stripe direction, of said gate electrode formed between said source layers of the first conductivity type, and y is a length of each of said source layers of the first conductivity type in the stripe direction.

7. A device according to claim 1, wherein, when said plurality of source layers of the first conductivity type are formed linearly in a predetermined array direction, a condition 1.5 µm≦x≦4 µm is satisfied where x is a length, in the array direction, of said gate electrode formed between said adjacent source layers of the first conductivity type.

8. A device according to claim 2, wherein a condition 1.5 µm≦x≦4 µm is satisfied where x is a length, in the stripe direction, of said gate electrode formed between said source layers of the first conductivity type.

9. A device according to claim 3, wherein a condition 1.5 µm≦x≦4 µm is satisfied where x is a length, in the stripe direction, of said gate electrode formed between said source layers of the first conductivity type.

10. A device according to claim 1, wherein said drift layer of the first conductivity type is also formed between said base layers of the second conductivity type so as to contact said gate insulating film.

11. A device according to claim 2, wherein said drift layer of the first conductivity type is also formed between said base layers of the second conductivity type so as to contact said gate insulating film.

12. A device according to claim 3, wherein said drift layer of the first conductivity type is also formed between said base layers of the second conductivity type so as to contact said gate insulating film.

13. A device according to claim 1, wherein said drain layer is of the first conductivity type.

14. A device according to claim 2, wherein said drain layer is of the first conductivity type.

15. A device according to claim 3, wherein said drain layer is of the first conductivity type.

16. A device according to claim 1, wherein said drain electrode comprises drain electrodes formed to be arrayed in a plurality of islands, and further comprising:
   a lower source interconnection which does not contact said gate electrode and electrically connects said adjacent source electrodes via a portion above said gate electrode;
   an upper source interconnection which has a longitudinal direction perpendicular to said lower source interconnection and contacts an upper portion of said lower source interconnection above said gate electrode;
   a lower drain interconnection which does not contact each drain layer and electrically connects adjacent drain electrodes via a portion above said drain layer; and
   an upper drain interconnection which has a longitudinal direction perpendicular to said lower drain interconnection and contacts an upper portion of said lower drain interconnection above said drain layer.

17. A device according to claim 2, wherein said drain electrode comprises drain electrodes formed to be arrayed in a plurality of islands, and further comprising:
   a lower source interconnection which does not contact said gate electrode and electrically connects said adjacent source electrodes via a portion above said gate electrode;
   an upper source interconnection which has a longitudinal direction perpendicular to said lower source interconnection and contacts an upper portion of said lower source interconnection above said gate electrode;
   a lower drain interconnection which does not contact each drain layer and electrically connects adjacent drain electrodes via a portion above said drain layer; and
   an upper drain interconnection which has a longitudinal direction perpendicular to said lower drain interconnection and contacts an upper portion of said lower drain interconnection above said drain layer.

18. A device according to claim 3, wherein said drain electrode comprises drain electrodes formed to be arrayed in a plurality of islands, and further comprising:
   a lower source interconnection which does not contact said gate electrode and electrically connects said adjacent source electrodes via a portion above said gate electrode;
   an upper source interconnection which has a longitudinal direction perpendicular to said lower source interconnection and contacts an upper portion of said lower source interconnection above said gate electrode;
   a lower drain interconnection which does not contact each drain layer and electrically connects adjacent drain electrodes via a portion above said drain layer; and
   an upper drain interconnection which has a longitudinal direction perpendicular to said lower drain interconnection and contacts an upper portion of said lower drain interconnection above said drain layer.

* * * * *